(12) United States Patent
McGrath

(10) Patent No.: US 6,847,920 B2
(45) Date of Patent: Jan. 25, 2005

(54) APPROXIMATION SEQUENCE PROCESSING

(75) Inventor: David S. McGrath, Rose Bay (AU)

(73) Assignee: Lake Technology Limited, Surry Hills (AU)

( * ) Notice: Subject to any disclaimer, the term of this patent is extended or adjusted under 35 U.S.C. 154(b) by 18 days.

(21) Appl. No.: 10/630,356

(22) Filed: Jul. 30, 2003

(65) Prior Publication Data

US 2004/0081244 A1 Apr. 29, 2004

(30) Foreign Application Priority Data

Aug. 1, 2002 (AU) .......................................... 2002950530

(51) Int. Cl.[7] ................................................. H04B 1/00
(52) U.S. Cl. ...................................... 702/189; 381/71.1
(58) Field of Search .............................. 702/189, 66, 69, 702/74, 110, 111, 179, 191, 194, 195, 196, 197; 381/71.1, 71.12, 94.1

(56) References Cited

U.S. PATENT DOCUMENTS 5,768,124 A * 6/1998 Stothers et al. ............... 700/38
6,445,801 B1 * 9/2002 Pastor et al. ............... 381/94.2
6,650,757 B1 * 11/2003 Zhou et al. ................. 381/71.4
2002/0172374 A1 * 11/2002 Bizjak ..................... 381/71.14

OTHER PUBLICATIONS

H. Kato. "Trellis Noise-Shaping Converters and 1-bit digital audio." Presented at the 112th Convention of the Audio Engineering Society, May 10–13, 2002. Munich, Germany. http://www.aes-singapore.org/SDM%20paper.pdf.

* cited by examiner

*Primary Examiner*—Edward Raymond
(74) *Attorney, Agent, or Firm*—Dov Rosenfeld; Inventek

(57) ABSTRACT

A method of producing an approximation sequence to a series of sample values, the method comprising the steps of (a) determining a first set having candidate partial sequences as members, each member comprising a plurality of elements; (b) selecting the first n elements of one of the members of the first set as a next output element for said approximation sequence; n a positive integer; (c) forming a second set having descendent candidate partial sequences as members from said first set; (d) applying a fitness filtering process to said second set to rank its members according to fitness for representing at least a corresponding portion of the series of input samples; (e) selecting at least some of the members of the second set to form a third set; and repeating steps (a) to (e) so as to produce said approximation sequence, wherein the third set of step (e) functions as the first set of the subsequent step (a).

22 Claims, 10 Drawing Sheets

APPROXIMATION SEQUENCE PROCESSING

RELATED PATENT APPLICATIONS

This invention claims priority under 35 USC 119 of Australian Application No. Australian 2002950530, inventor David McGrath, filed on Aug. 1, 2002, titled "Approximation Sequence Processing," assigned to the assignee of the present invention, and incorporated herein by reference.

BACKGROUND

1. Field of the Invention

The present invention relates broadly to a method and system for producing a sequence approximating a series of sample values. The sample value series may be never-ending. The present invention will be described herein with reference to a method and system for producing a 1-bit sequence from samples of an input waveform.

2. Background of the Invention

The present invention has been developed after extensive studies in the field of Sigma-Delta modulation. Sigma-delta modulators are normally utilized to convert analog signals to sequences of corresponding 1-bit values such that the filtering of such a 1-bit sequence by a low pass filter results in a reproduction of the original analog signal or a close version thereof. For a background description of the operation of 1-bit sigma-delta modulators, reference is made to standard textbooks in the field such as "Delta-Sigma Data Converters, Theory Design and Simulation" by Norsworthy, et al., IEEE press, 1997.

More specifically, the accurate approximation of an analog input signal by a sequence of 1-bit values wherein the bits take on the usual +1 and −1 values was initially investigated. The design being such that upon filtering of the sequence of 1-bit values, a close approximation of the original analog signal is returned.

Turning now to FIG. 1–4, there is illustrated an example of the steps in a normal 1-bit conversion process. In FIG. 1, there is illustrated an example input waveform 10, with a maximum amplitude that is no greater than +/−P. The normal conversion process involves sampling the waveform of FIG. 1 at predetermined points in time separated by a time interval so as to produce a series of sample values, e.g., 12 as illustrated in FIG. 2. Next, the core process of converting the sample values to corresponding +1 and −1 values is illustrated in FIG. 3 with a sample value illustrated, e.g., 14. Subsequently, as illustrated in FIG. 4, a one-bit output stream is output 16 corresponding to the set of sample values determined in FIG. 3. The determination of the sample values can proceed by many prior art methods. The preferred embodiment of the present invention is directed to the creation of an improved determination method which produces lower relative levels of noise than that provided by prior art methods.

The maximum input signal amplitude relative to the maximum output signal amplitude, (P) must typically be less than 1, and in practice, most techniques used to produce one-bit output streams will require that P is no greater than approximately 0.5. A further preferred embodiment of the present invention is directed to the generation of one-bit sequences wherein the maximum signal level (P) may be significantly greater than 0.5, with typical values as high as 0.75 being achievable, without a significant reduction of Signal to Noise Ratio (SNR).

SUMMARY

In accordance with a first aspect of the present invention, there is provided a method of producing a sequence (an "approximation sequence") to approximate a series of sample values, the method comprising the steps of (a) determining a first set having candidate partial sequences as members, each member comprising a plurality of elements; (b) selecting the first n elements, n being any positive integer value, of one of the members of the first set as a next output element for said approximation sequence; (c) forming a second set having descendent candidate partial sequences as members from said first set; (d) applying a fitness filtering process to said second set to rank its members according to fitness for representing at least a corresponding portion of the series of input samples;(e) selecting at least some of the members of the second set to form a third set; and repeating steps (a) to (e) so as to produce said approximation sequence, wherein the third set of step (e) functions as the first set of the subsequent step (a).

In one embodiment, the method further comprises, between steps (b) and (c), the step of (b*) as follows:

(b*) deleting one or more members of said first set. Step (b*) may comprise removing all members of the first set which do not begin with the selected first n elements of step (b).

Preferably, step (e) is conducted in a manner such as to maintain a predetermined number of members in the first set for each iteration.

In one embodiment, each element of the approximation sequence has m possible values, where m in an integer that can take on any value greater than 1, and step (c) comprises, for each member of the first set, forming corresponding $m^n$ descendent partial sequences as members of the second set by appending each possible value/combination to and removing the first n elements of the member.

In another embodiment, each element of the approximation sequence has m possible values me being an integer greater than 1, and step (c) comprises, for each member of the first set, forming less than $m^n$ corresponding descendent partial sequences as members of the second set by appending a limited number of possible value/combinations to and removing the first n elements of the member.

In one embodiment, step (d) comprises one or more of a group comprising low pass filtering, finite impulse response filtering, and recursive filtering each candidate partial sequence of the first set.

Advantageously, step (d) comprises giving highest precedence to members of the first set which begin with an element having a same sign as the next sampling point.

In one embodiment, the method further comprises the step of sampling a waveform signal to obtain the series of sample values.

Preferably, step (d) comprises applying the fitness filtering process to the members of the second set such as to rank them according to fitness for approximating the series of sample values from the first sample value up to and including the next sample value to be approximated.

In one embodiment, the output elements are output in the form of single-bit or multi-bit samples.

In accordance with a second aspect of the present invention, there is provided a system for producing a sequence (an "approximation sequence") to approximate a series of sample values, the system comprising a processing unit arranged, in use, to (a) determine a first set having candidate partial sequences as members, each member comprising a plurality of elements; (b) select the first n elements—n being a positive integer—of one of the members of the first set as a next n output elements for said approximation sequence; (c) form a second set having descendent candidate partial sequences as members from said first set; (d) apply a fitness filtering process to said second set to rank its members according to fitness for representing at least a corresponding portion of the series of input samples; (e) select at least some of the members of the second set to form a third set; a control unit arranged, in use, such that the processing unit repeats steps (a) to (e), wherein the third set of step (e) functions as the first set of the subsequent step (a); and an output unit arranged, in use, to output the selected at least one output element during each iteration, whereby the approximation sequence is produced.

In one embodiment, the processing unit is further arranged, in use, to, between steps (b) and (c), (b*) delete one or more members of said first set.

Preferably, step (b*) comprises removing all members of the first set which do not begin with the selected at least first element of step (b).

Advantageously, the processing unit is arranged, in use, to conduct step (e) in a manner such as to maintain a predetermined number of members in the first set for each iteration.

In one embodiment, each element of the approximation sequence has m possible values, m an integer greater than 1, and step (c) comprises, for each member of the first set, forming corresponding $m^n$ descendent partial sequences as members of the second set by appending each possible value/combination to and removing the first n elements of the member.

In another embodiment, each element of the approximation sequence has m possible values, m an integer greater than 1, and step (c) comprises, for each member of the first set, forming less than $m^n$ corresponding descendent partial sequences as members of the second set by appending n elements with a limited number of possible values/combinations to and removing the first n elements of the member.

Preferably, step (d) comprises one or more of a group comprising low pass filtering, finite impulse response filtering, and recursive filtering each candidate partial sequence of the first set.

In one embodiment, step (d) comprises giving highest precedence to members of the first set which begin with an element having a same sign as the next sampling point.

Preferably, the system further comprises a sampling unit for sampling a waveform signal to obtain the series of sample values.

Advantageously, step (d) comprises applying the fitness filtering process to the members of the second set such as to rank them according to fitness for approximating the series of sample values from the first sample value up to and including the next n sample values to be approximated.

In one embodiment, the output unit is arranged, in use, such that the output elements are output in the form of single-bit or multi-bit samples.

BRIEF DESCRIPTION OF THE DRAWINGS

Preferred embodiments of the invention will now be described, by way of example only, with reference to the accompanying drawings in which.

DETAILED DESCRIPTION

Figure 3:
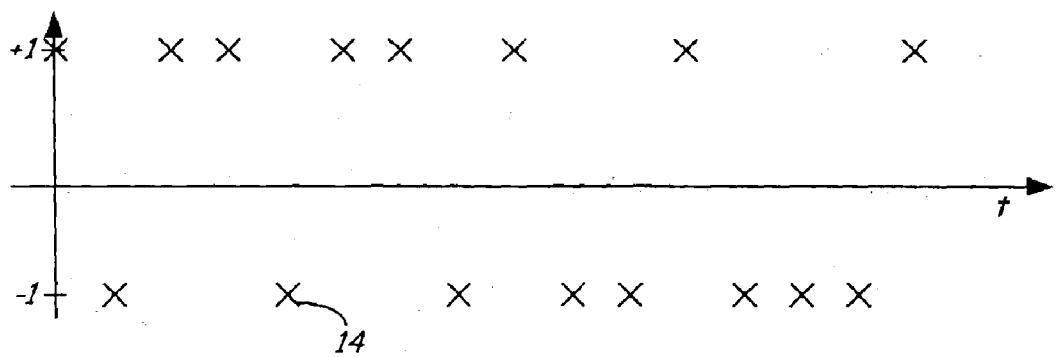
FIG. 3 illustrates an example equivalent 1-bit sequence.
Figure 4:
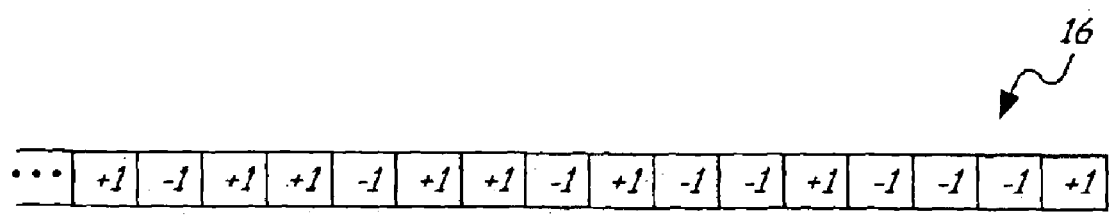
FIG. 4 illustrates an output 1-bit series corresponding to that of FIG. 3.

In the preferred embodiment, as noted previously, an improved method is provided for determining a sequence we call an approximation sequence that approximates a corresponding series of sample values. In the preferred embodiment, the approximation sequence is a 1-bit output stream that approximates a corresponding multi-bit sampled input stream. Hence, the problem can be generally stated that given a set of sample values such as those illustrated in FIG. 2, what form of output stream such as that shown in FIGS. 3 and 4 should be produced.

Figure 5:
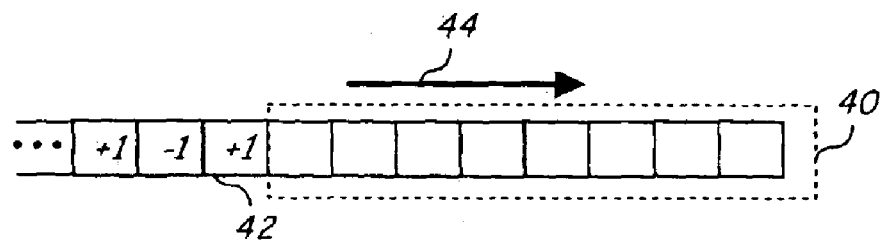
FIG. 5 illustrates the process of a preferred embodiment.

As illustrated in FIG. 5 the preferred embodiment solves that problem by utilizing a partial sequence window 40 containing a certain number of elements (eight, in this example), wherein the first element of the partial sequence window 40 is utilized as the next output element e.g. 42, and subsequently the partial sequence window 40 is moved by one element, as illustrated by arrow 44 in FIG. 5.

Figure 6:
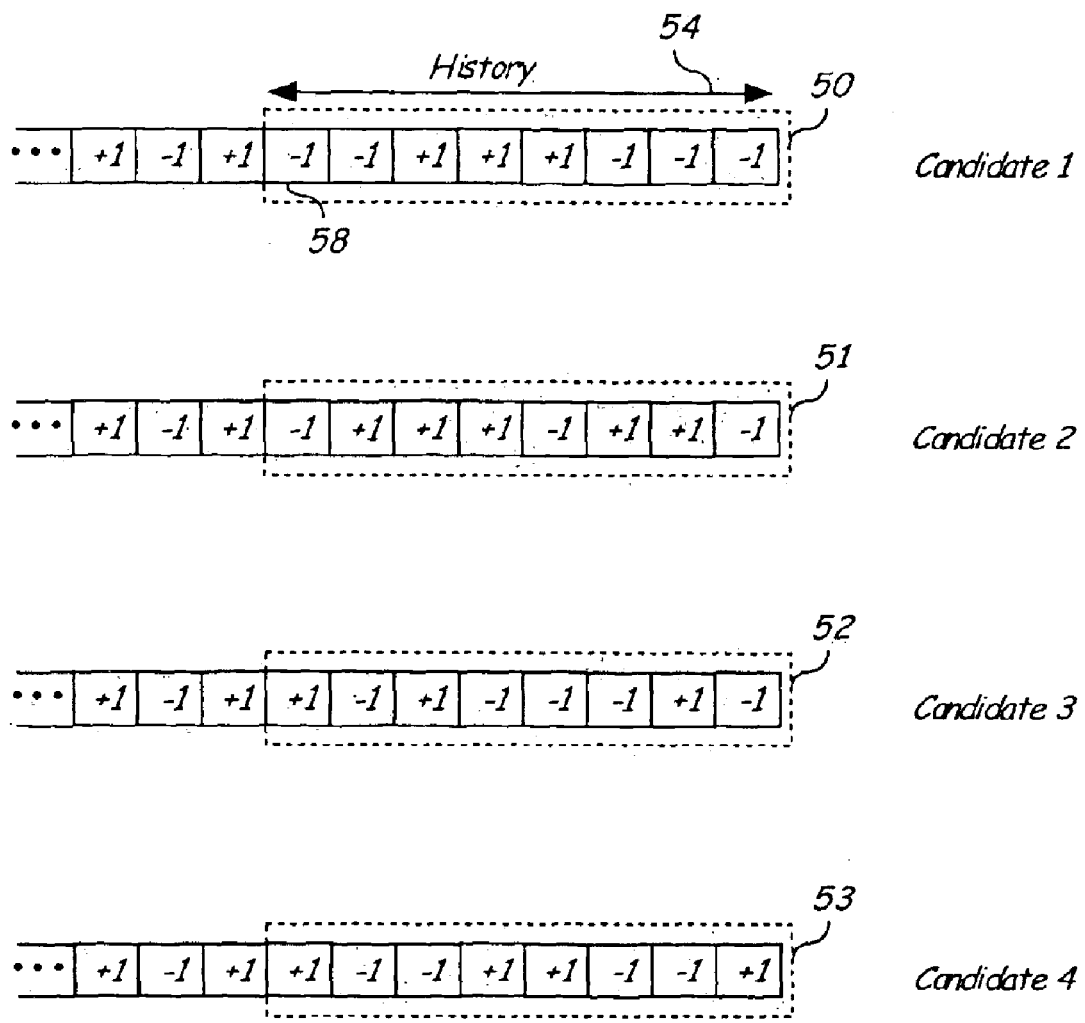
FIG. 6 illustrates a detail of the process of a preferred embodiment.

The preferred embodiment thus proceeds by outputting elements one at a time to an output stream. The preferred embodiment generates a series of output stream candidates and ranks them to determine which candidate is to be utilized. In FIG. 6 there is illustrated a series of candidate partial sequences in the form of bit strings 50–53. The structure of the candidate output streams is characterized by two parameters. The first is a history parameter 54 which defines the length of the candidate streams as illustrated in FIG. 6. The history e.g., 54 defines the length of the processing window of candidate 50 utilized in the preferred embodiment. The number of candidate streams 50–53 (also referred to as the population size) is a second parameter and, in the example illustrated in FIG. 6, is equal to 4 with the history being equal to 8 elements. At each iteration, the first element of the fittest string is output e.g., 58 and the window 50 "moved along". In the embodiment of FIG. 6, there are illustrated the four possible candidates 50–53 at this stage of processing.

After the output of an element, e.g. 58 as part of the "build-up" of the output sequence, some candidates that do not match the output bit e.g. 58 may now be deleted (e.g. 52, 53). The process proceeds by proposing two possible descendants for each of the remaining candidates (e.g. 50, 51). For example, in FIG. 7 there is illustrated the process of taking the first candidate 50 of FIG. 6 and proposing two descendent candidates 60, 62 with the candidates 60, 62 being created by appending a +1 data value 68 and a −1 data value 70 respectively, and removing the first element 58 of candidate 50.

The number of descendent candidates is preferably maintained at the original number of candidates for the subsequent approximation iteration, through appropriate culling before or after the creation of the descendants. For example, in the arrangement of FIG. 6, there were 4 candidates 50–53 in the original group. The first output bit 58 of the highest ranking candidate 50 was output. The descendent population is culled to only include those candidate sequences having a matching bit to the chosen most fittest candidate, in the example shown candidates 50 and 51. Further culling routines and criteria, preferably in order of fitness, can be provided for in the process to arrive at the desired number.

Figure 2:
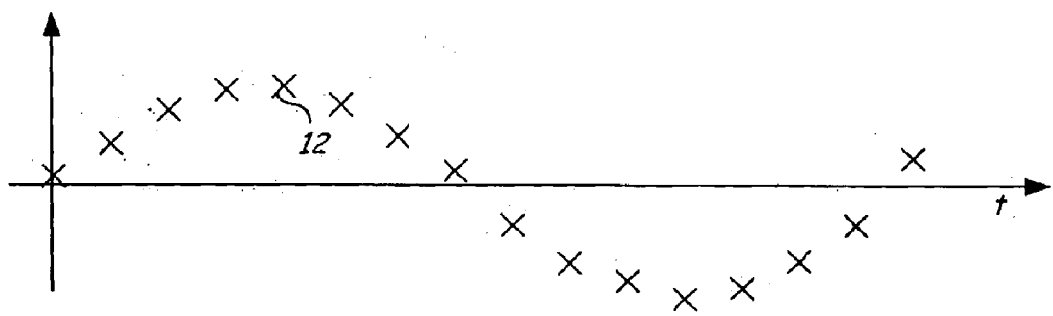
FIG. 2 illustrates the sample equivalent of the signal of FIG. 1.
Figure 7:
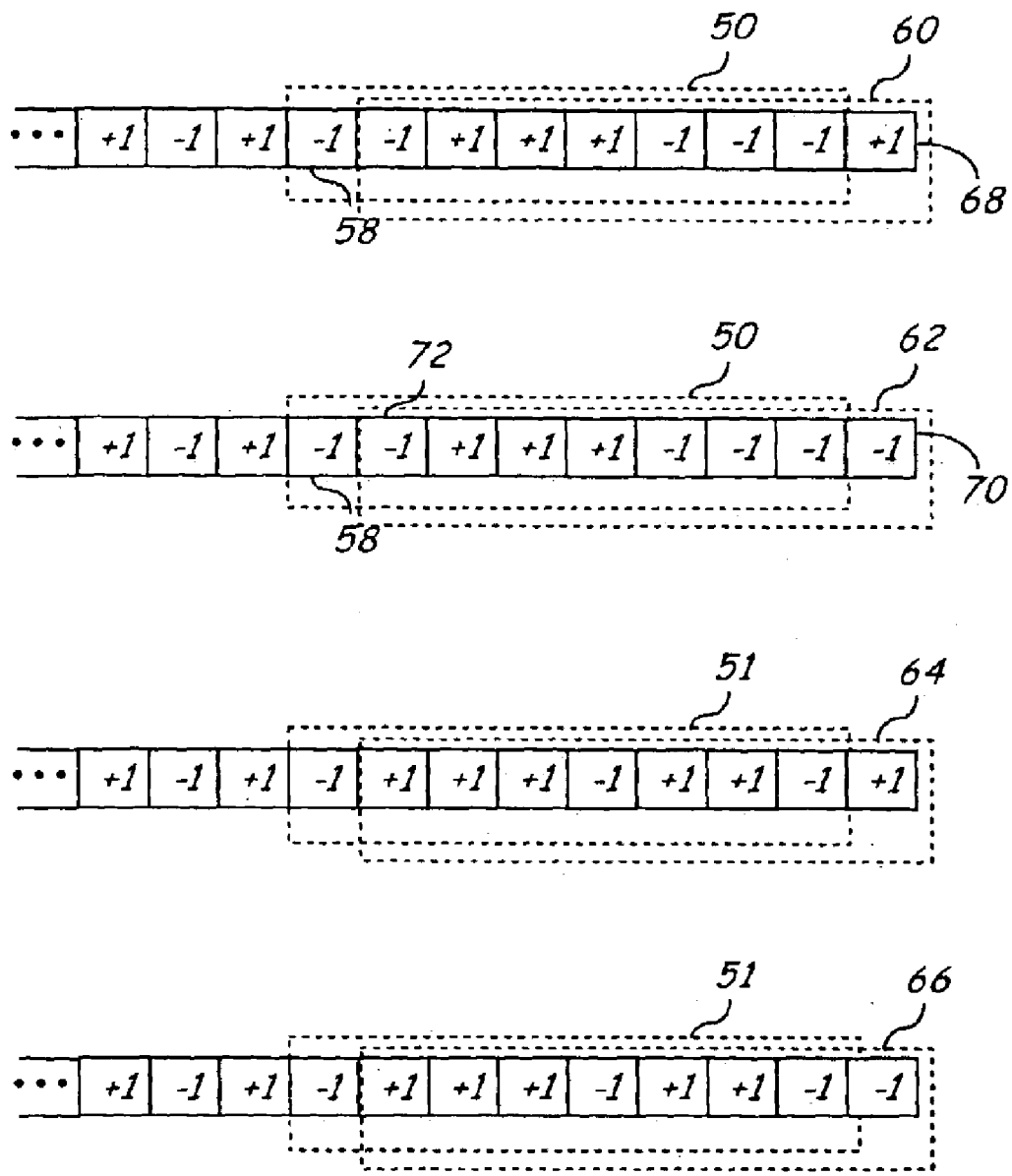
FIG. 7 is a schematic illustration of the process of determining candidate children, embodying the present invention.

Thus, 4 descendants 60, 62, 64 and 66 shown in FIG. 7 become the "next" possible candidates. Those candidates not having a matching first element may be removed from the candidate list. The next possible candidates are subjected to a fitness filtering process to determine which candidates are most suitable. This proceeds by ranking them in a fitness order. The fitness ranking is then used to select the best candidates for the next iteration of the process. Further culling can include applying a filter such as a finite impulse response filter or a recursive filter to the candidate strings and determining a closest match to the corresponding original input signal portion (e.g. as shown in FIG. 2). The most suitable candidate, e.g. 62, is then determined having the closest characteristics to the input signal, and its first element 72 is output.

Figure 8:
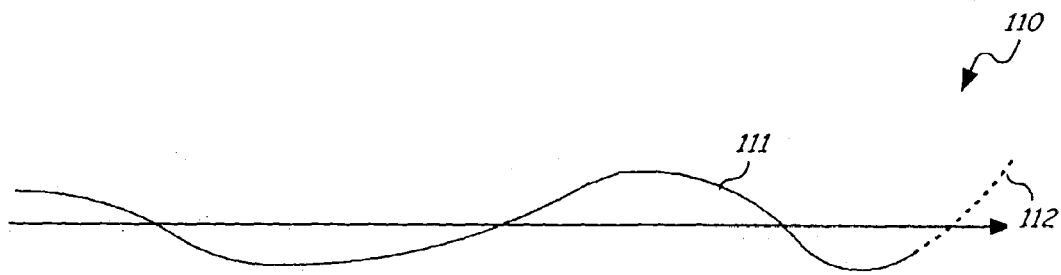
FIG. 8 illustrates a more specific example of the preferred embodiment.

Turning of FIG. 8, there is illustrated an example wherein a sequence of output elements has already been determined, and a population of 4 candidates A, B, C and D, each with a history length of 4, have been selected (by previous iterations of the process).

Figure 9:
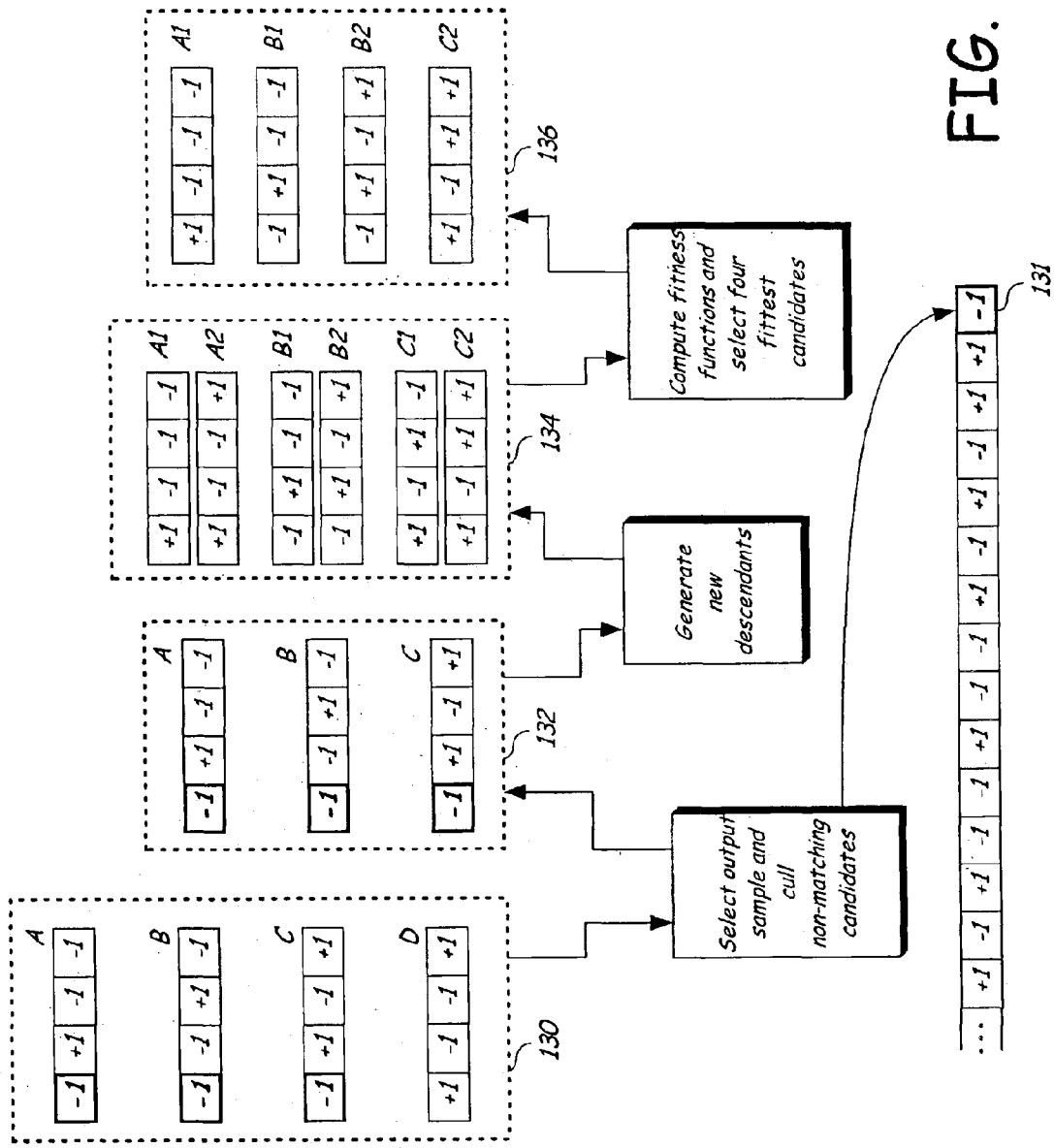
FIG. 9 illustrates the processing applied to the example of FIG. 8, as per the preferred embodiment.

Turning to FIG. 9, there is illustrated a general flow chart of the steps involved in one iteration of the method in the example embodiment, based on the set of candidates A, B, C and D shown in FIG. 8. The example embodiment is an iterative method, and starts with the selection of a new output sample, by either (a) choosing the first sample of the 'fittest' member of the candidate population 130 (A, B, C, or D) or (b) choosing the most 'popular'0 first sample. In the example of FIG. 9, the selected output sample 131 is −1, chosen because it occurs in a greater proportion of the population 130 i.e. it is most popular. If −1 and +1 occur in the first sample of the candidates in equal quantities, then some added criteria is required to select the new output sample. This may include the choice of the first sample from the candidate with the highest 'fitness' score, or may include the use of an arbitrary selection. Once the new output element has been determined, the candidate population is culled to an intermediate set 132 by removal of all candidates that do not match the selected output element in the example candidate D. A pair of descendants is generated for each member of the culled population, by removing the first sample, and appending −1 or +1. The set of new descendants 134 thus comprise A1, A2, B1, B2, C1 and C2 in the shown example. Next, the fitness of each candidate is computed, and the four fittest candidates are maintained in a final set 136, in the example shown A1, B1, B2 and C2, ready for the next iteration of the method.

Figure 10:
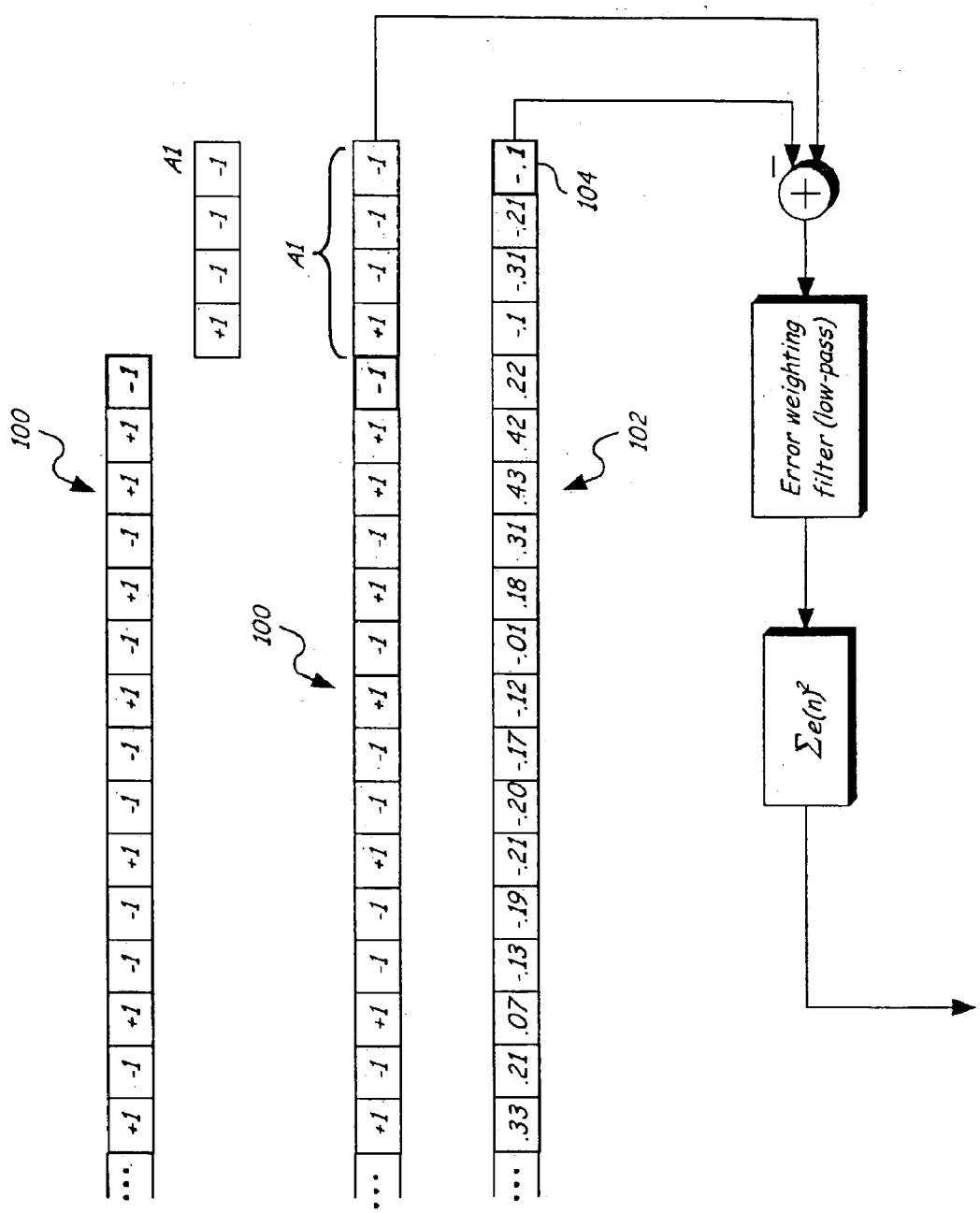
FIG. 10 illustrates a method for determining the fitness of a candidate embodying the present invention.

FIG. 10 illustrates the method by which the fitness of each candidate is determined in the example embodiment. Even though a candidate A1 has a relatively short length (the history length), the fitness function is based on the augmented sequence, formed by appending the candidate sequence A1 onto the end of the current output sequence 100. The input sequence 102—including a new input sample 104 that was not used in the previous iteration of the method—is subtracted from the augmented sequence, and the difference signal is filtered to produce a filtered error measure that has frequency dependent weighting. The magnitude of the frequency weighted error signal is used as the negative of the fitness measure to be maximized, e.g., the candidate or subset is selected that has the largest fitness measure, i.e., the smallest filtered error measure magnitude.

Figure 11:
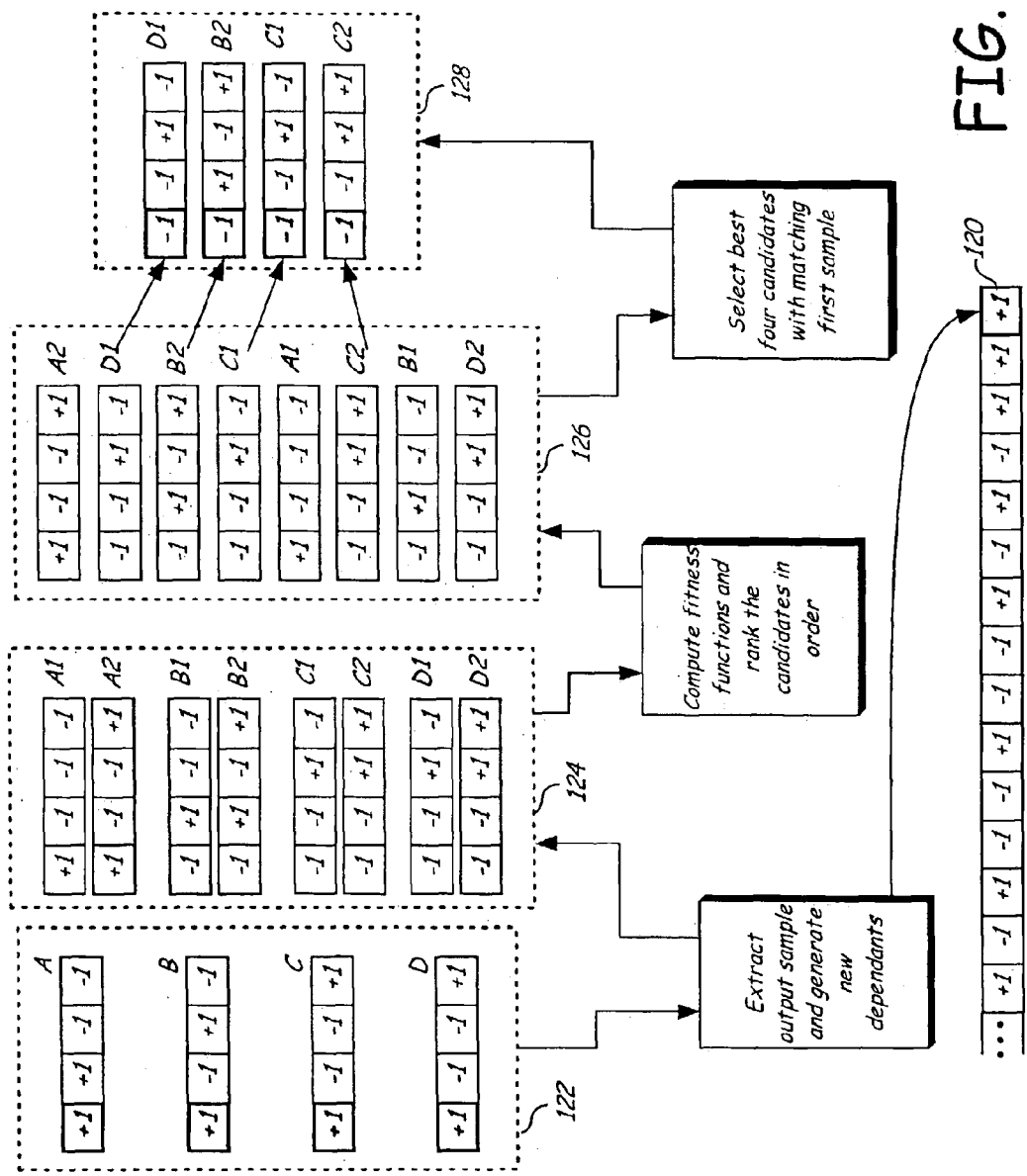
FIG. 11 illustrates a variation of the process shown in FIG. 9, as per a further preferred embodiment.

In FIG. 11, an alternative example embodiment is illustrated, showing a modified fitness selection method. In the embodiment of FIG. 11, the candidate population is forced to always have the same value in the first sample of each candidate, thus ensuring that no culling of the population is required prior to the generation of the descendants. Thus, in FIG. 11 after extraction of the output sample 120 on the basis of a set of candidates 122, descendants are formed for each of the members of the set of candidates 122 to form the intermediate set of descendants 124. No candidates were culled from the set 122 because the set was guaranteed to always contain candidates with identical initial values. The method by which the next generation of candidates is selected from the set of descendants 124 is adapted to ensure that the set of descendants is chosen such that the fittest set of four are selected with the proviso that all four must have the same value in their first sample. Thus, in FIG. 11 fitness functions are computed and the descendants 124 ranked in order, to form a ranked set of descendants 126. In the example embodiment, the way of ensuring that this criteria is satisfied, is to select the fittest four descendants that start with +1, and the fittest four descendants that start with −1. If either of these sets contains less than 4 members, for example, if there are less than 4 descendants starting with +1, as in the example shown in FIG. 11, then that set will be culled. Of the un-culled sets, the fittest is selected based any of a number of different criteria, including (a) selecting the set with the highest average fitness, (b) selecting the set which contains the fittest overall member, or (c) selecting the set with the worst (fourth) member having the highest fitness relative to the worst (fourth) member of the other sets. In the example shown in FIG. 11, this leaves D1, B2, C1 and C2 as the next set of candidates 128.

Figure 12A:
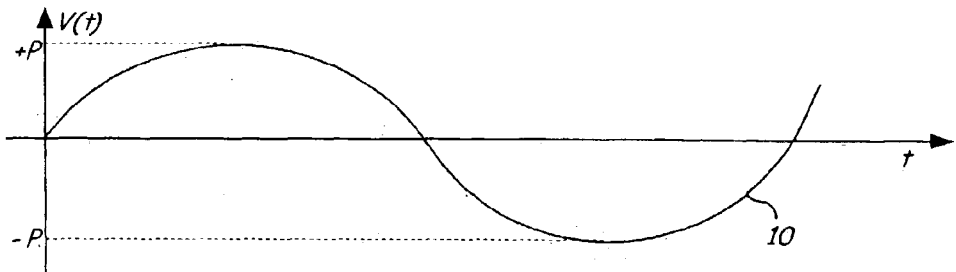
FIGS. 12A–12C illustrate variants of each of FIGS. 1–3, respectively, in which the output samples are restricted to 4 allowable quantization levels.
Figure 12B:
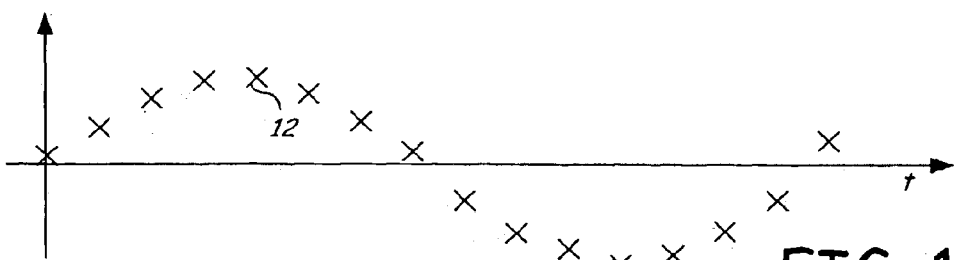
Figure 12C:
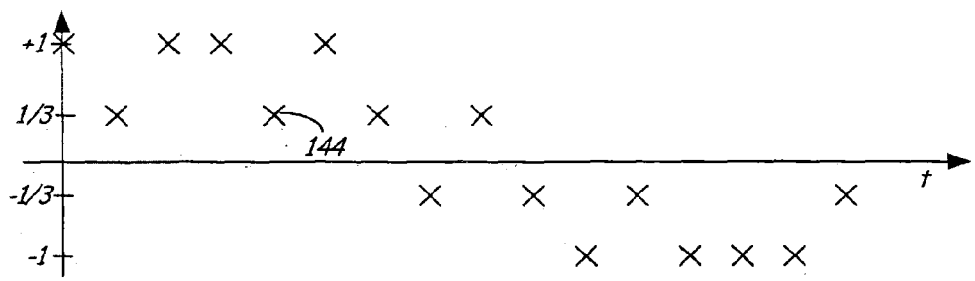

In alternative preferred embodiments, the method of the present invention may be utilized to generate quantized approximation sequences where the number of allowable output values m for each element is more than 2. For example, referring to FIG. 12(*c*), if each element has 4 allowable values, rather than the 1-bit values used in the embodiments described above, then each output sample can take on any one of 4 possible values. Looking again at FIG. 11, it will be clear to those skilled in the art that the method illustrated in FIG. 11 can be extended to allow for this larger set of allowable output values. In this case, the expanded population 124 of new candidate sequences will be 4 times larger than the original population 122.

It is further noted that the values for each element itself may be output as a multi-bit output sample, e.g. 16-bit audio samples for recording onto a Compact Disc, rather than each element being output as a 1-bit sample as in the embodiments described above. In such an embodiment, each element has effectively $2^{16}$ allowable "values". It may be impractical to test all 65536 possible descendents in such an embodiment, as this will lead to a population of e.g. 4 initial candidates (122) growing to a new set of 262144 new dependants (124) (referring by analogy to FIG. 11). Thus, in a further preferred embodiment, a small sub-set of all potential output samples is selected, so that each candidate will then spawn only a relatively small number of dependants, thus maintaining the population at a more manageable level.

Figure 13:
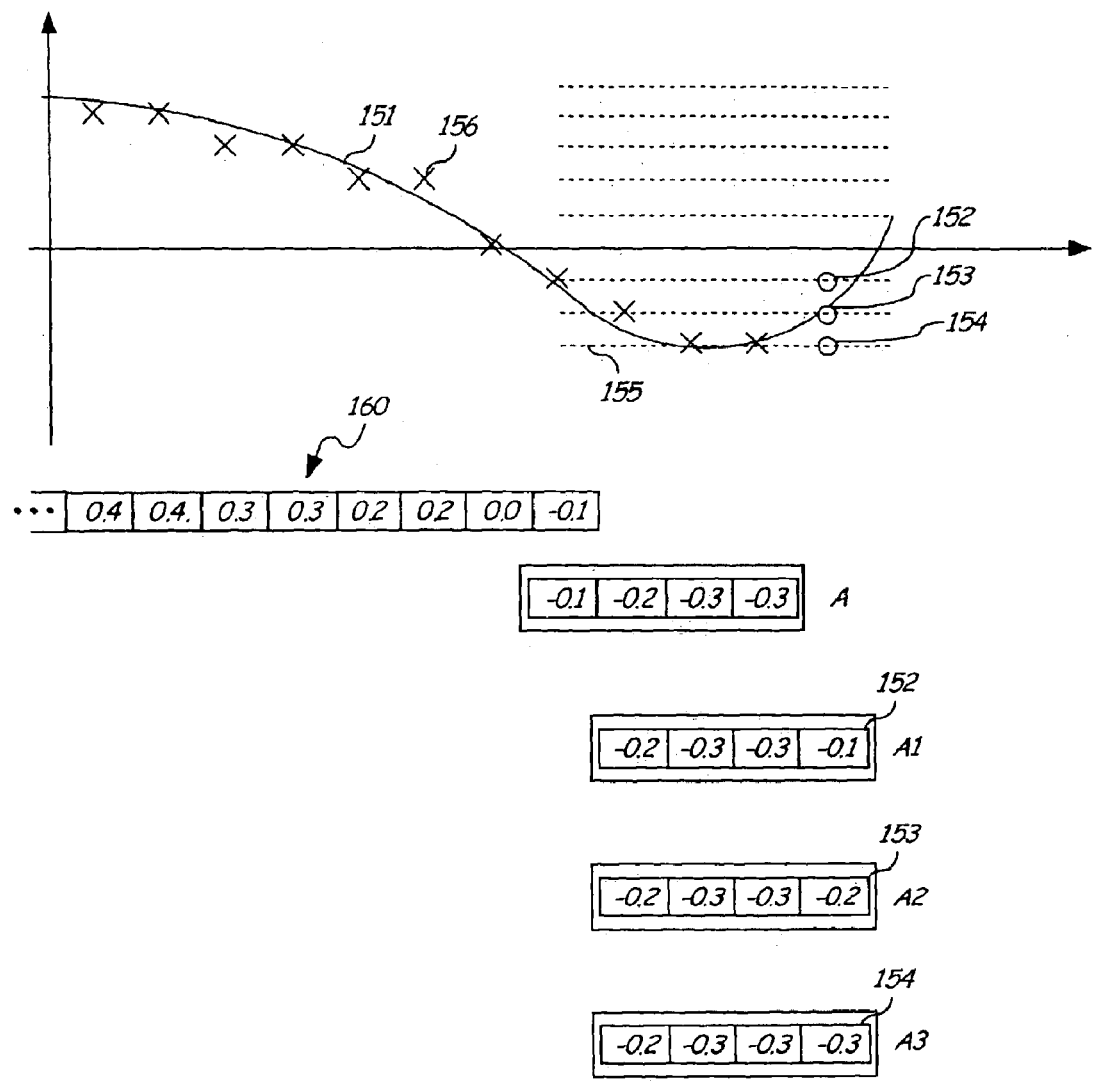
FIG. 13 illustrates an alternative embodiment where the number of allowable quantization levels, m, is large.

This method is illustrated in FIG. 13, in which an original input signal 151 is approximated by a series of quantized sample values, e.g., 156. Each sample value is constrained to lie on one of m quantization levels, e.g., 155. In the example of FIG. 13, the output sample sequence 160 has been determined, and one of the next candidates is sequence (A). The method of generating the new descendants (A1, A2, A3) from this candidate (A) is carried out, in an example embodiment, by first selecting three allowable values for the next element out of the possible m values. Whilst the number of allowable quantization values m may be very large, in the example we start with a reasonable estimate quantization level 153 for the next sample, and add it's immediate neighbors 152 and 154, to form a set of three alternatives. Hence, our candidate population will grow by a factor of three each time the descendant candidates are generated.

Furthermore, the method of the present invention may be utilized to generate quantized approximation sequences where the number n of output elements for each output "iteration" is more than 1. For example, if 2 elements are output at each iteration, rather than the one element as in the embodiments described above, then the 'sliding window' (compare 40 in FIG. 5) is moved forward by 2 elements in each iteration of the method.

Figure 1:
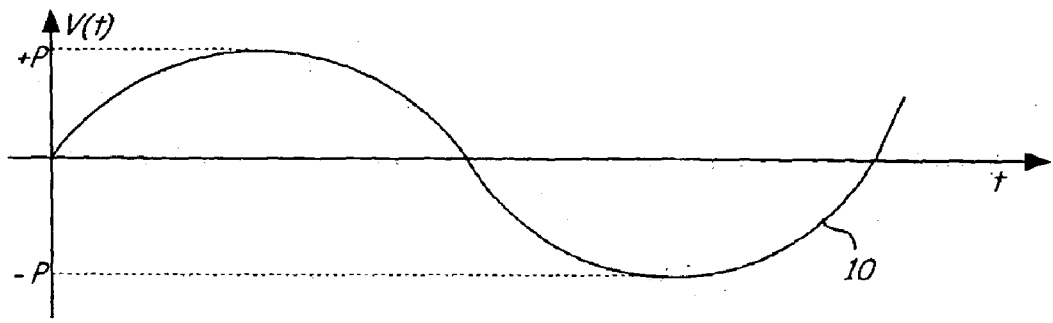
FIG. 1 illustrates a time domain signal to be converted to a corresponding 1-bit signal.

It was found that, when utilizing the aforementioned example methods for the creation of 1-bit output streams, the corresponding noise floor of the 1-bit output stream was substantially lowered leading to improved results. Hence, the aforementioned example methods are able to produce improved 1-bit sequences. In addition, is was found that the maximum input signal level P (FIG. 1) could be made larger when utilizing the aforementioned example methods, in contrast to alternative prior art implementations that can fail to operate correctly when presented with input signals of excessive magnitude.

It would be evident to those skilled in the art that the preferred embodiment uses a search method that may have advantages over using a prior art searching procedure, e.g., a prior art MinMax procedure in that a MinMax procedure often suffers from exponential complexity growth problems. The utilization of candidate pruning allows for pruning to branches of a tree whilst simultaneously maintaining many possible alternative end solutions. The utilization of the history allows for some form of depth first searching to take place whilst simultaneously limiting the number of branches at each node.

The aforementioned methods can be programmed into a computer system such as a personal computer type system so as to process input signals to produce 1-bit output signals for use.

It will be appreciated by the person skilled in the art that numerous modifications and/or variations may be made to the present invention as shown in the specific embodiments without departing from the spirit or scope of the invention as broadly described. The present embodiments are, therefore, to be considered in all respects to be illustrative and not restrictive.

In the claims that follow and in the summary of the invention, except where the context requires otherwise due to express language or necessary implication the word "comprising" is used in the sense of "including", i.e. the features specified may be associated with further features in various embodiments of the invention.

I claim:

1. A method of producing a sequence approximating a series of sample values, the method comprising the steps of:
   (a) determining a first set having candidate partial sequences as members, each member comprising a plurality of elements;
   (b) selecting the first n elements of one of the members of the first set as the next n output elements for said approximation sequence, n being a positive integer;
   (c) forming a second set having descendent candidate partial sequences as members from said first set;
   (d) applying a fitness filtering process to said second set to rank its members according to fitness for representing at least a corresponding portion of the series of input samples;
   (e) selecting at least some of the members of the second set to form a third set; and
   repeating steps (a) to (e) so as to produce said approximation sequence, wherein the third set of step (e) functions as the first set of the subsequent step (a).

2. A method as claimed in claim 1, wherein the method further comprises, between steps (b) and (c), the step of:
   (b*) deleting one or more members of said first set.

3. A method as claimed in claim 2, wherein step (b*) comprises removing all members of the first set which do not begin with the selected first n elements of step (b).

4. A method as claimed in claim 1, wherein step (e) is conducted in a manner such as to maintain a predetermined number of members in the first set for each iteration.

5. A method as claimed in claim 1, wherein each element of the approximation sequence has m possible values, m being an integer greater than 1, and step (c) comprises, for each member of the first set, forming corresponding $m^n$ descendent partial sequences as members of the second set by appending each possible value/combination to and removing the first n elements of the member.

6. A method as claimed in claim 1, wherein each element of the approximation sequence has m possible values, m being an integer greater than 1, and step (c) comprises, for each member of the first set, forming less than $m^n$ corresponding descendent partial sequences as members of the second set by appending a limited number of possible value/combinations to and removing the first n elements of the member.

7. A method as claimed claim 1, wherein step (d) comprises one or more of a group comprising low pass filtering, finite impulse response filtering, and recursive filtering each candidate partial sequence of the first set.

8. A method as claimed in claim 1, wherein step (d) comprises giving highest precedence to members of the first set which begin with an element having a same sign as the next sampling point.

9. A method as claimed in claim 1, wherein the method further comprises the step of sampling a waveform signal to obtain the series of sample values.

10. A method as claimed in claim 1, wherein step (d) comprises applying the fitness filtering process to the members of the second set such as to rank them according to fitness, when appended to the previous output elements, for approximating the series of sample values from the first sample value up to and including the next sample value to be approximated.

11. A method as claimed in claim 1, wherein output elements are output in the form of single-bit or multi-bit samples.

12. A system for producing a sequence approximating a series of sample values, the system comprising:

a processing unit arranged, in use, to:

(a) determine a first set having candidate partial sequences as members, each member comprising a plurality of elements;

(b) select the first n elements of one of the members of the first set as a next output element for said approximation sequence, n being a positive integer;

(c) form a second set having descendent candidate partial sequences as members from said first set;

(d) apply a fitness filtering process to said second set to rank its members according to fitness for representing at least a corresponding portion of the series of input samples;

(e) select at least some of the members of the second set to form a third set;

a control unit arranged, in use, such that the processing unit repeats steps (a) to (e), wherein the third set of step (e) functions as the first set of the subsequent step (a); and an output unit arranged, in use, to output the selected at least one output element during each iteration, whereby the approximation sequence is produced.

13. A system as claimed in claim 12, wherein the processing unit is further arranged, in use, to carry out, between steps (b) and (c), the step of:

(b*) deleting one or more members of said first set.

14. A system as claimed in claim 13, wherein step (b*) comprises removing all members of the first set which do not begin with the selected first n elements of step (b).

15. A system as claimed in claim 12, wherein the processing unit is arranged, in use, to conduct step (e) in a manner such as to maintain a predetermined number of members in the first set for each iteration.

16. A system as claimed in claim 12, wherein each element of the approximation sequence has m possible values, me being an integer greater than 1, and step (c) comprises, for each member of the first set, forming corresponding $m^n$ descendent partial sequences as members of the second set by appending each possible value/combination to and removing the first n elements of the member.

17. A system as claimed in claim 12, wherein each element of the approximation sequence has m possible values, m being an integer greater than 1, and step (c) comprises, for each member of the first set, forming less than $m^n$ corresponding descendent partial sequences as members of the second set by appending a limited number of possible values/combinations to and removing the first n elements of the member.

18. A system as claimed in claim 12, wherein step (d) comprises one or more of a group comprising low pass filtering, finite impulse response filtering, and recursive filtering each candidate partial sequence of the first set.

19. A system as claimed in claim 12, wherein step (d) comprises giving highest precedence to members of the first set which begin with an element having a same sign as the next sampling point.

20. A system as claimed in claim 12, wherein the system further comprises a sampling unit for sampling a waveform signal to obtain the series of sample values.

21. A system as claimed in claim 12, wherein step (d) comprises applying the fitness filtering process to the members of the second set such as to rank them according to fitness for approximating the series of sample values from the first sample value up to and including the next sample value to be approximated.

22. A system as claimed in claim 12, wherein the output unit is arranged, in use, such that the output elements are output in the form of single-bit or multi-bit samples.

* * * * *

UNITED STATES PATENT AND TRADEMARK OFFICE
CERTIFICATE OF CORRECTION

PATENT NO. : 6,847,920 B2
DATED : January 25, 2005
INVENTOR(S) : McGrath

It is certified that error appears in the above-identified patent and that said Letters Patent is hereby corrected as shown below:

Column 10,
Line 3, kindly change "me being" to -- m being --.

Signed and Sealed this

Twelfth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,847,920 B2  Page 1 of 1
DATED : January 25, 2005
INVENTOR(S) : McGrath It is certified that error appears in the above-identified patent and that said Letters Patent is hereby corrected as shown below:

Column 5,
Line 45, kindly change "0 first sample" to -- first sample --.

Signed and Sealed this

Twenty-first Day of June, 2005

JON W. DUDAS
*Director of the United States Patent and Trademark Office*